United States Patent [19]
Rollett

[11] Patent Number: 4,553,103
[45] Date of Patent: Nov. 12, 1985

[54] RC-ACTIVE FILTERS

[75] Inventor: John M. Rollett, Suffolk, England

[73] Assignee: British Telecommunications, London, England

[21] Appl. No.: 508,187

[22] Filed: Jun. 27, 1983

[30] Foreign Application Priority Data

Jun. 29, 1982 [GB] United Kingdom ............ 8218770

[51] Int. Cl.[4] .................................. H03F 1/34
[52] U.S. Cl. ........................... 330/107; 330/109; 330/126; 307/520; 328/167
[58] Field of Search ............... 330/107, 109, 126, 294; 307/520; 328/167

[56] References Cited

FOREIGN PATENT DOCUMENTS 1811628 2/1972 Fed. Rep. of Germany .
1604189 9/1971 France .
1230496 5/1971 United Kingdom .

OTHER PUBLICATIONS

IEEE Transactions on Circuit Theory, vol. CT-19, No. 4, Jul. 1972, pp. 398–403, New York, US, T. A. Hamilton et al.: "A Single-Amplifier Biquad Active Filter", Figures 1a, 1b; p. 398, II The General Configuration—p. 403, line 5.

IEEE Transactions on Circuits and Systems, vol. CAS-22, No. 4, Apr. 1975, pp. 329–333, New York, US, A. Boctor: "Design of a Third-Order Single Amplifier Filter".

Fujii, "Predistorted RC Active Filters with Low Pole Sensitivity to Finite GB of Single Pole Operational Amplifier", *The Transactions of the IECE of Japan*, vol. E63, No. 10, Oct. 1980, pp. 715–722.

Primary Examiner—James B. Mullins
Attorney, Agent, or Firm—Cushman, Darby & Cushman

[57] ABSTRACT

Second and third-order RC active filter sections are described both based on a similar basic twin-tee network. The circuits include a single operational amplifier and are such that the poles and zeros of the network can be adjusted with little interaction by varying resistances in sequence. It is possible to construct the sections using capacitors of wide tolerance.

18 Claims, 9 Drawing Figures

RC-ACTIVE FILTERS

DESCRIPTION

This invention relates to RC-active filters.

A common method used to construct RC-active filters is to cascase second order sections to form a filter of even order and to add a single first-order section to form a filter of odd order. To increase the steepness of the transition region between passband and stopband without increasing the number of sections it is usual to employ sections having transmission zeros at finite frequencies. Power consumption is reduced if each section is composed with only one operational amplifier. Thus m operational amplifiers can be used to construct a filter of order 2m or 2m−1. In addition each first-order section requires one capacitor and one resistor, and each second-order section requires from two to four capacitors and from three to about seven resistors.

The present invention in one aspect relates to a single-amplifier, second order section, with or without finite transmission zeros; and, in a further aspect to a single-amplifier third-order section with finite transmission zeros.

Second-order filter sections are known which employ a single operational amplifier. For example the circuits disclosed in IEEE Transactions on Circuit Theory Vol. CT-19, No. 4, July 1972, pp 398-403. However one principal feature of a practical, useful circuit is the freedom to choose component values. In these prior art circuits the values of the capacitors have to be equal (or occasionally a factor of two) and the two resistors R are also required to be equal in value. Another important feature of a practical circuit is the capacity for independently adjusting parameters such as Q-factor (or bandwidth in the case of bandpass filters), the present invention, in contrast to prior proposals enables the Q-factor to be adjusted independently of the other transfer function parameters $S_0$ or $S_2$.

The third-order section can be used to replace one first-order section and one second-order section in an odd order filter so that m operational amplifiers can be used to construct a filter of order 2m+1. Alternatively m third-order sections can be combined to form a filter with a non-standard transfer function of order 3m. The saving of one amplifier in an odd order filter is an important advantage, and the sensitivity of an even order filter constructed with the sections can be reduced compared with a conventional filter designed to meet the specification with the same number of amplifiers.

Many electronic systems require simple filtering with not too sharp a roll-off, and often the system will already include a gain-setting operational amplifier, which can be used in the filter.

The design of a third-order filter section employing a single operational amplifier is described in an article by S. A. Boctor in IEEE Transactions on Circuits and Systems, Vol. CAS-22 No. 4 April 1975. However, the values of two capacitors in this section must have a precise ratio determined by the desired response, and therefore each capacitor must have a narrow tolerance of at most ±1%, and more probably ±½%. Such capacitors are expensive. Furthermore, the required ratio of the values of these capacitors may necessitate at least one of them having a non-standard value, and this is a serious disadvantage. Another constraint upon this circuit is that three RC products must be made equal. These features have made it difficult to realise a practical low-pass 3rd order section based on this design.

It is one object of the present invention to provide a third-order lowpass filter section and a third-order highpass filter section in which these constraints are relaxed to enable more freedom in the choice of component values.

According to the present invention in one aspect a there is provided second-order lowpass or highpass filter section comprising a single high-gain, high input impedance, inverting amplifier with low output impedance whose output terminal provides the output terminal of the section, an input terminal, and a twin-tee network, comprising resistance and capacitance elements and either or both a first resistance element ($R_a$) or a capacitance element ($C_E$), and having a first node ($\alpha$) connected to the inverting input of the amplifier via a second resistance element ($R_b$), to the output terminal of the amplifier via a third resistance element ($R_c$), and to circuit ground via a second capacitance element ($C_D$); and a second node ($\beta$) connected to the inverting input of the amplifier via a third capacitance element ($C_F$), to the output terminal of the amplifier via the parallel combination of a fourth capacitance element ($C_G$) and a fourth resistance element ($R_g$), and to circuit ground via a fifth resistance element ($R_h$). The input terminal being connected with to the first node ($\alpha$) via the first resistance element ($R_a$) or to the second node ($\beta$) via the first capacitance ($C_E$).

According to the present invention in another aspect there is provided a second-order bandpass filter section comprising a single high-gain, high input impedance, inverting amplifier with low output impedance whose output terminal provides the output terminal of the second, an input terminal, and a twin-tee network, comprising resistance and capacitance elements and having a first node ($\alpha$) connected to the inverting input of the amplifier via a first resistance element ($R_b$), to the output terminal of the amplifier via a second resistance element ($R_c$), and a second node ($\beta$) connected to the inverting input of the amplifier via a first capacitance element ($C_F$), to the output terminal of the amplifier via the parallel combination of a second capacitance element ($C_G$) and a third resistance element ($R_g$), and further comprising either:

(i) a connection between the input terminal and the first junction point via a third capacitor element ($C_A$), and a connection between the second junction point and circuit ground via a fourth resistance element ($R_h$), or (ii) a connection between the input terminal and the second junction point via a fifth resistance element ($R_e$) and a connection between the first junction point and circuit ground via a fourth capacitance element ($C_D$), or (iii) a connection between the input terminal and the second junction point via a fifth resistance element ($R_C$) and a connection between the input terminal and the first junction point via a third capacitance element ($C_A$).

According to the present invention in another aspect there is provided a second-order allpass or notch filter section comprising a single high-gain, high input impedance, inverting amplifier with low output impedance whose output terminal provides the output terminal of the section, an input terminal, and a twin-tee network, comprising resistance and capacitance elements and having a first node ($\alpha$) connected to the inverting input of the amplifier via a first resistance element ($R_b$), to the output terminal of the amplifier via a second resistance element ($R_c$), and a second node ($\beta$) connected to the inverting input of the amplifier via a first capacitance element ($C_F$), to the output terminal of the amplifier via the parallel combination of a second capacitance element ($C_G$) and a third resistance element ($R_g$), and further comprising series resistance elements ($R_x$) and ($R_y$) connected between connected between the input terminal and circuit ground, the junction between these series resistance elements being connected to the non-inverting input terminal of the amplifier, and further comprising either:

(i) a connection between the input terminal and the first junction point via a third capacitance element ($C_A$), and a connection between the second junction point and circuit ground via a fourth resistance element ($R_h$), or (ii) a connection between the input terminal and the second junction point via a fifth resistance element ($R_e$) and a connection between the first junction point and circuit ground via a fourth capacitance element ($C_D$), or (iii) a connection between the input terminal and the second junction point via a fifth resistance element ($R_c$) and a connection between the input terminal and the first junction point via a third capacitance element ($C_A$).

According to the present invention in a further aspect there is provided a third-order lowpass filter section comprising a single high-gain, high input impedance, inverting amplifier with low output impedance whose output terminal provides the output terminal of the section, a twin-tee network, comprising resistance and capacitance element and an input network, comprising an input terminal connected to an input resistance element ($R_p$); the twin-tee network having a first node ($\alpha$) connected to that terminal of the input resistance element remote from the input terminal via a first resistance element ($R_a$), to the inverting input of the amplifier via a second resistance element ($R_a$), to the inverting input of the amplifier via a second resistance element ($R_b$), to the output terminal of the amplifier via a third resistance element ($R_c$), and to circuit ground via a first capacitance element ($C_D$); and a second node ($\beta$) connected to that terminal of the input resistance element remote from the input terminal via a second capacitance element ($C_E$), to the inverting input of the amplifier via a third capacitance element ($C_F$), to the output terminal of the amplifier via the parallel combination of a fourth capacitance element ($C_G$) and a fourth resistance element ($R_g$), and to circuit ground via a fifth resistance element ($R_h$).

According to the present invention there is also provided a third-order highpass filter section comprising a single high gain, high input impedance, inverting amplifier with low output impedance whose output terminal provides the output terminal of the section, a twin-tee network comprising resistance and capacitance element, and an input network comprising an input junction point connected to the input terminal of the section via a capacitor element ($C_p'$).

the twin-tee network having a first node connected to the input junction point via a first resistance element ($R_a'$), to the inverting input of the amplifier via a second resistance element ($R_b'$), to the output terminal of the amplifier via a third resistance element ($R_c'$) and to circuit ground via a first capacitance element ($C_D$); and a second node connected to the input junction point via a second capacitance element ($C_E'$), to the inverting input of the amplifier by a third capacitance element ($C_F'$), to the output terminal of the amplifier via the parallel combination of a fourth capacitance element ($C_G'$) and a fourth resistance element ($R_g'$), and to circuit ground via a fifth resistance element ($R_h'$).

Embodiments of the present invention will now be described, by way of example only, with reference to the accompanying drawings. In the drawings.

Figure 4:
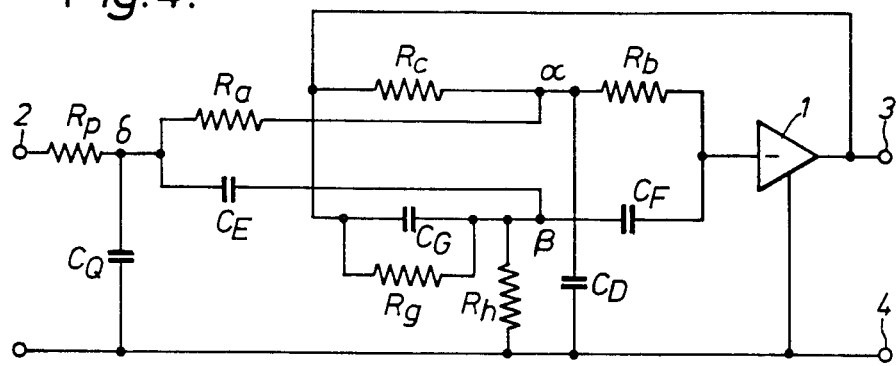
FIG. 4 is a circuit diagram of a third-order lowpass filter section in accordance with the invention.
Figure 6:
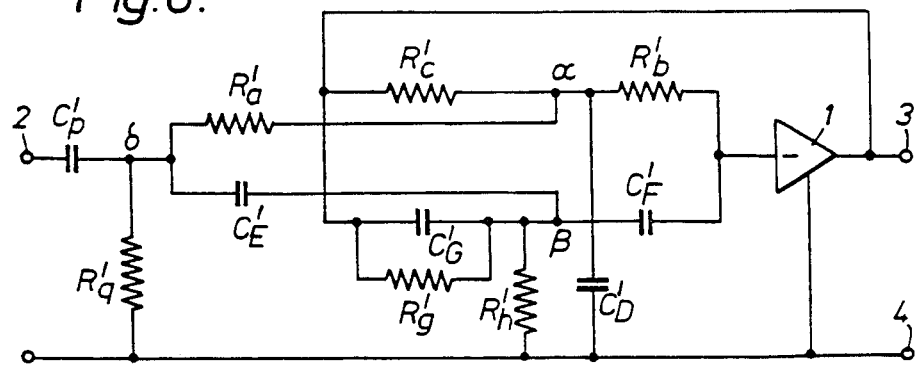
Figure 7:
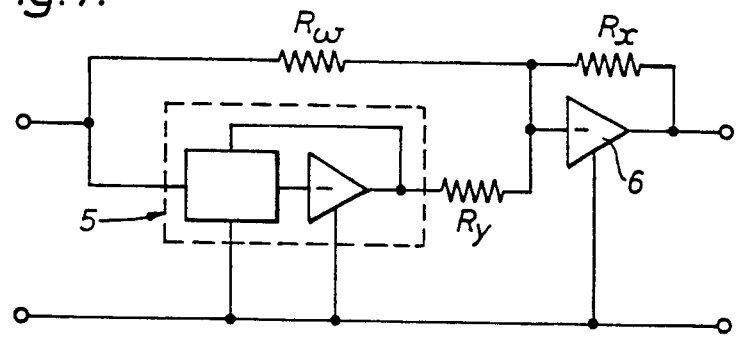
Figure 8:
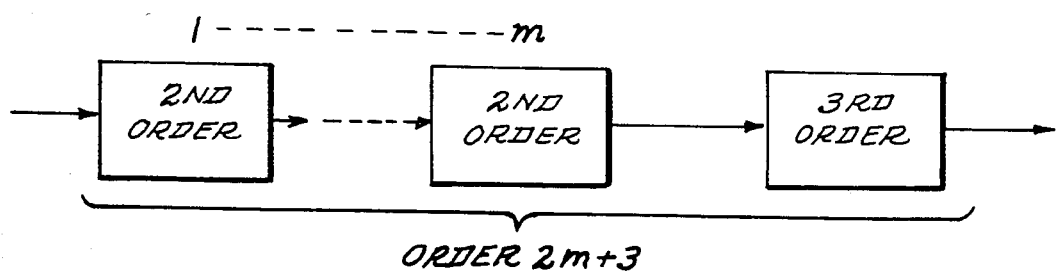
Figure 9:
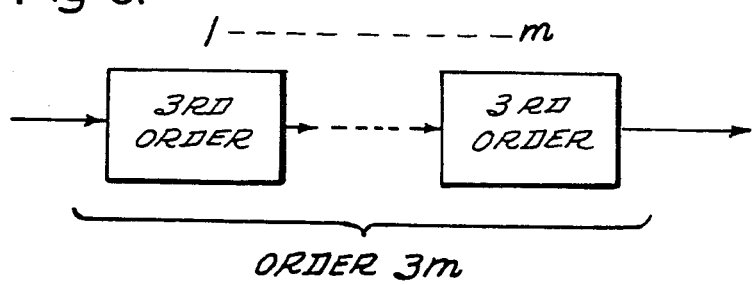

FIG. 6 is a circuit diagram of a third-order highpass filter section in accordance with the invention, FIG. 7 is an allpass filter network based on the lowpass filter section of FIG. 4, and FIG. 8 is a schematic depiction of an odd order $2m+3$ RC-active filter including m second order sections and one third order section, and FIG. 9 is a schematic depiction of an order $3m$ RC-active filter including m third order sections.

Figure 1:
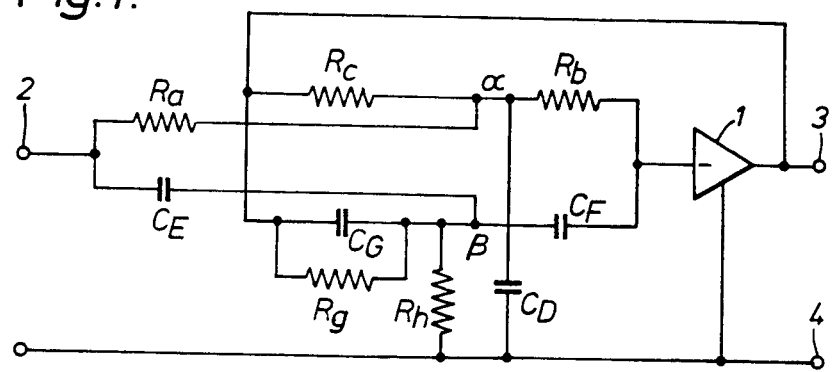
FIG. 1 is a circuit diagram of a general second-order lowpass or highpass filter section in accordance with the invention.

Referring to FIG. 1, a second-order lowpass or highpass filter section is composed of five resistances, indicated by a resistance symbol R and a lower case suffix, four capacitances indicated by capacitance symbol C and an upper case suffix, an operational amplifier 1, an input terminal 2, an output terminal 3 and the circuit ground rail 4.

The circuit includes a twin T network with internal nodes $\alpha$ and $\beta$. A resistance $R_a$ connects the input terminal 2 to the first node $\alpha$ and a resistance $R_b$ connects node $\alpha$ to the inverting input of the operational amplifier 1. The output terminal of the amplifier is connected to the circuit output 3 and via a feedback path to the node $\alpha$ via a resistance $R_c$. The node $\alpha$ is connected to ground via a capacitance $C_D$.

The node $\beta$ is connected to the input terminal 2 by a capacitance $C_E$ and to the inverting input of the amplifier via a capacitance $C_F$. The node is further connected to the output terminal of the amplifier via the parallel combination of a capacitance $C_G$ and a resistance $R_g$, and this is connected to ground via resistance $R_h$.

With suitable values for the elements this circuit will realise a second-order section with finite transmission zeros which can be used as a building block in either highpass or lowpass filters. If component $C_E$ is omitted, then the circuit realises a lowpass allpole section (with transmission zeros at infinity); and if component $R_a$ is omitted, the circuit realises a highpass section (with transmission zeros at zero frequency).

The analysis of a circuit with so many components is straightforward but cumbersome. Use therefore will be made in the following of a simplified notation. Briefly, the admittances of the components are denoted solely by their suffix letters, and plus signs are omitted, so that for example $abcD = (1/R_a) + (1/R_b) + (1/R_c) + sC_D$, where s is the complex frequency variable; full stops are inserted between two symbols to indicate multiplication.

Denoting the negative of the transfer function of FIG. 1 by T, the numerator and denominator by Num and Den, we have $$T = \text{Num}/\text{Den} \qquad (1)$$

where $$\text{Num} = (F \cdot E \cdot abcD + b \cdot a \cdot EFGgh) \quad (2)$$

$$+ \Phi(f_T) \quad (3)$$

The last term indicates that the denominator includes a function of the amplifier gain-bandwidth product $f_T$; this function may be neglected, as a first approximation.

The twin-tee structure of the circuit is thus apparent and it is also clear that abcD is the sum of the admittances joined to the internal mode node $\alpha$ of one tee, and EFGgh is the sum of the admittances joined to the corresponding node $\beta$ of the second tee. If now the tees are balanced by choosing the component values so that the admittances sums have the same phase angle, then one admittance sum is equal to a scalar (say $\mu$) multiplied by the order, and therefore $$abcD = \mu \cdot EFGgh \quad (4)$$

The transfer function now is:

$$T = \frac{(\mu \cdot F \cdot E + b \cdot a)}{(\mu \cdot F \cdot Gg + b \cdot c)} \quad (5)$$

By representing capacitances by capital letters, instead of admittances of capacitances as in the foregoing, in conventional notation, this expression is written $$T = \frac{\mu C_F C_E s^2 + G_b G_a}{\mu C_F C_G s^2 + \mu C_F G_g s + G_b G_c} \quad (6)$$

where s is the complex frequency variable.

The expression for the transfer function is very simple, and allows the element values to be chosen almost by inspection. If the required transfer function has the form:

$$T = \text{constant} \times \frac{(s^2 + s_o^2)}{s^2 + (s_2/q_2)s + s_2^2} \quad (7)$$

Then we obtain by equating terms the following relationships, after allowing capital letters to denote capacitances rather than admittances of capacitances as in the foregoing (the context makes it clear which convention is being used).

$$S_o^2 = b \cdot a/(\mu F \cdot E) \quad (8)$$

$$S_2^2 = b \cdot c/(\mu F \cdot G) \quad (9)$$

$$q_2 = G(s_2/g) \quad (10)$$

provided in addition that condition (4) holds. These four equations i.e. 4, 8–10, can easily be solved to yield simple expressions for the conductances in terms of the capacitances and the co-efficients of the required transfer function. Thus after suitable values have been chosen for the capacitances (normally preferred values), the conductance values can be found from the following expressions:

$$\mu = D/EFG \quad (11)$$

$$a = E \cdot s_o \sqrt{\mu} \quad (12)$$

$$b = F \cdot s_o \sqrt{\mu} \quad (13)$$

$$c = G(s_2^2/s_o) \sqrt{\mu} \quad (14)$$

$$g = G(s_2/q_2) \quad (15)$$

$$h = (abc/\mu) - g \quad (16)$$

The capacitances must, of course, be chosen in such a way that the expression for h is positive.

If the capacitance values are known precisely, then the conductances can be easily determined and the network constructed to have the desired response. More usually, the capacitance values have a tolerance of for example ±1% or ±5%. It is then important to be able to achieve the required response by functional trimming of the conductances. A particular advantage of the circuit in accordance with the invention is that it is easy to trim to function, because of the simple form of the equations relating element values to transfer function.

Thus it can be seen from equations (8) and (10) that the zero frequency $s_o$ can be adjusted by trimming conductance a and the pole frequency $s_2$ by trimming conductance c, provided conductance b is first set to its nominal value. From equation (11) the Q factor of the section $q_2$ can be adjusted by trimming g.

A suitable trimming routine is thus as follows:

(a) Set $G_a$ and $G_h$ to their nominal values.

(b) Apply a signal of frequency $s_2$ to the input terminal 2 of the circuit of FIG. 1 and trim $G_b$ for minimum signal at the output terminal, this sets the zero frequency.

(c) Apply a signal of frequency $s_2$ to the input terminal, and trim $G_c$ until the phase difference between the input signal and the output signal is equal to the value calculated from the transfer function (after allowing for the phase shift through the amplifier, as those skilled in the art will appreciate); this sets the pole frequency of the section sufficiently close to the required value.

(d) Apply a signal of frequency $S_2$ to the input terminal, and trim $G_g$ until the gain at this frequency is correct; this sets the Q-factor of the section. In the case of the section of highest Q in a filter, the signal should be applied to the input of the complete filter, and the component $G_g$ adjusted until the passband of the whole filter is as flat as possible (or has the desired response if not flat).

It is an important property of the network that this trimming routine can be successfully carried using unidirectional trimming and without iteration. Thus for example a thick film resistive network, with discrete capacitors bonded on, can be functionally trimmed by initially setting resistors $R_b$, $R_c$ and $R_g$ to values between (say 10% and 40% below their nominal values, and then trimmed in sequence by increasing their values using air-abrasion or laser-cutting techniques. The network is well suited for cheap mass production using such manufacturing methods in conjunction with automatic measuring instrumentation.

In the foregoing it has been assumed that the function $\Phi(f_T)$ appearing in equation 3 is negligible. It can be shown that the first-order effects of the finite gain-bandwidth product $f_T$ of the amplifier can be offset by small adjustments to the values of $G_c$ and $G_g$, if all the values are determined by calculation. However, if the conductances are trimmed according to a routine such as the one given above, the effects of the amplifier $f_T$ (and its other non-ideal properties) are automatically taken into account, to a first-order approximation.

In the foregoing the use of the circuit shown in FIG. 1 has been described as a second-order section with finite transmission zeros. If component $C_E$ is omitted, the circuit realises a lowpass allpole section (with transmission zeros at finite frequency). Much of the analysis above applies with suitable modification to this use of the circuit. Thus the trimming routine can be used with the omission of step (b). Similarly, of component $R_a$ is omitted, the circuit realises a highpass section, with transmission zeros at zero frequency. The treatment above can be applied with suitable adaptation, and again the trimming routine can be applied, omitting step (b).

Besides the lowpass and highpass versions of the circuit, bandpass, allpass and notch filter versions exist. The bandpass versions can be understood by referring to FIG. 2, which shows a circuit that realises a bandpass filter but contains more components than is strictly necessary. The transfer function of this circuit is:

$$T = \frac{F \cdot e \cdot AbcD + b \cdot A \cdot eFGgh}{F \cdot Gg \cdot AbcD + b \cdot c \cdot eFGgh + \Phi(f_T)} \quad (17)$$

As before, the function $\Phi(f_T)$ will be neglected, as a first approximation.

After balancing the twin tees, the transfer function becomes:

$$T = \frac{\mu F \cdot e + b \cdot A}{\mu F \cdot Gg + b \cdot c} \quad (18)$$

To achieve a bandpass section it is only necessary to provide one of the two components e and A; in each case a further component can be omitted.

Alternatively, if both e and A are provided, two other components can be omitted. The three versions of the bandpass section are therefore as follows: all require components $C_G$, $C_F$, $R_g$, $R_b$ and $R_c$, plus
(i) $C_A$ and $R_h$ (omitting $R_e$, $C_D$)
(ii) $R_e$ and $C_D$ (omitting $C_A$, $R_h$)
(iii) $C_A$ and $R_e$ (omitting $C_D$, $R_h$)
Trimming routines can be developed similar to those already described.

The second-order allpass transfer function has the following general form:

$$\frac{s^2 - a_1 s + a_o}{s^2 + a_1 s + a_o} \quad (19)$$

and the 'notch' filter transfer function has the form:

$$\frac{s^2 + a_o}{s^2 + a_1 s + a_o} \quad (20)$$

Figure 2:
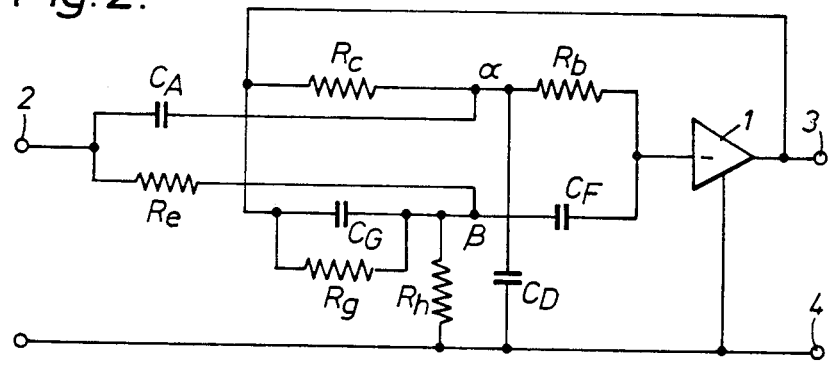
FIG. 2 is a circuit diagram of a second-order bandpass section.
Figure 3:
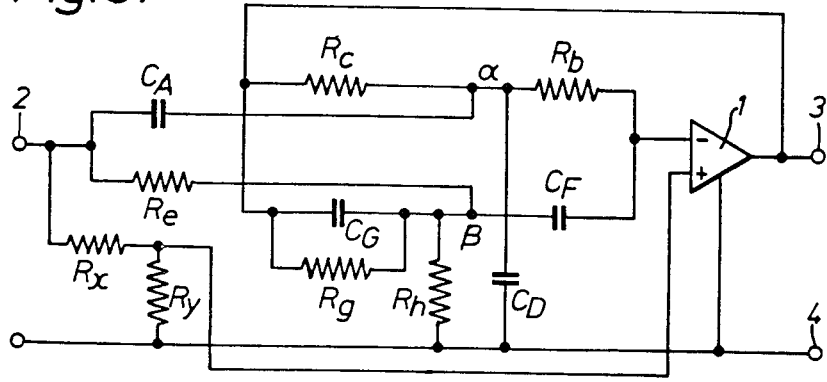
FIG. 3 is a circuit diagram of a second order allpass or notch filter section.

The circuit shown in FIG. 3 can be designed to realise either of these two transfer functions (to within a constant factor). It comprises the general bandpass circuit of FIG. 2 with the addition of two components $R_x$ and $R_y$ forming a potentionmeter which feeds a fraction of the input voltage to the positive (non-inverting) input of a differential-input operational amplifier, whose inverting input is employed as in the circuit of FIG. 2.

If we denote $(R_x/R_y)$ by m, then the general transfer function of the circuit of FIG. 3 is $$T = \frac{\mu F \cdot Gs^2 + [\mu F \cdot h + b \cdot D - m(\mu F \cdot e + b \cdot A)] s + b \cdot c}{(1 + m) \{\mu F \cdot Gs^2 + \mu F \cdot gs + b \cdot c\}} \quad (21)$$

Hence the general condition for achieving an allpass section is, from (19), $$\mu F \cdot h + b \cdot D - m(\mu F \cdot e + b \cdot A) = \mu F \cdot g \quad (22)$$

The condition for realising a notch section is, from (20)

$$\mu F \cdot h + b \cdot D - m(\mu F \cdot e + b \cdot A) = 0 \quad (23)$$

Corresponding to the three versions of the bandpass circuit these are three versions of the allpass circuit. All three versions require components $C_G$, $C_F$, $R_g$, $R_b$, $R_c$, $R_x$ and $R_y$, plus
(i) $C_A$ and $R_h$; in this case the condition (20) reduces to $$\mu F \cdot h - mb \cdot A = -\mu F \cdot g \quad (24)$$

(ii) $R_e$ and $C_D$; is in this case the condition becomes $$b \cdot D - m\mu F \cdot e = -\mu F \cdot g \quad (25)$$

(iii) $C_A$ and $R_e$; here the condition is $$-m(\mu F \cdot e + b \cdot a \cdot) = -\mu F \cdot g \quad (26)$$

In the notch filter case only two versions of the circuit exist. The components are the same as for versions (i) and (ii) above, and the conditions are:
(i)

$$\mu F \cdot h - mb \cdot A = 0 \quad (27)$$

(ii)

$$b \cdot D - m\mu F \cdot e = 0 \quad (28)$$

In all versions of the allpass and notch filter sections, the conditions (22) to (28) can be satisfied by trimming either $R_x$ or $R_y$, after the components making up the bandpass filter have been suitable adjusted.

As a general comment, applying to all the circuits described above with reference to FIGS. 1–3, it should be emphasised that their practical usefulness derives from the following features:

(1) The capacitor values can be chosen freely, and their ratios are not specifically determined by the transfer function it is desired to realise.

(2) The Q-factor (or bandwidth in the case of bandpass filters) is dependent on component $R_g$, which does not enter (except indirectly through the twin-tee balance condition) into the expressions for the other transfer function parameters, $s_o$ or $s_2$. Consequently it is possible to adjust the Q-factor (or bandwidth) after the other parameters have been adjusted with (virtually) no effect on them. This is a very important property from a practical point of view, as it is often necessary to make fine adjustments to passband response by trimming the magnitude via the Q-factor, particularly of the section with highest Q.

(3) The existence of simple uni-directional trimming routines, which allow the circuits to be built using thin or thick film resistive networks and attached capacitors, which can be adjusted to function by air-abrasion or laser-trimming the resistors, thus facilitating cheap mass-production. The capacitors used can have relatively wide tolerance ($\pm 2\%$ or $\pm 5\%$), since the departures from the nominal values are compensated by the resistor trimming routine to give the required functional response.

As an example a fifth-order lowpass filter was designed suitable for limiting an audio telephone channel to frequencies below 3.4 kHz. A transfer function was determined which would have less than 0.1 dB ripple in the passband, and 32 dB stopband loss at frequencies above 4.6 kHz. The filter comprises a first-order section and two second-order sections, and the normalised transfer function is as follows:

$$\frac{(s^2 + 1.7143)(s^2 + 3.5104)}{(s + 0.7582)(s^2 + 0.814s + 0.8886)(s^2 + 0.1792s + 1.1347)}$$

This transfer function is denormalised to 3.54 kHz to yield the required audio range.

The schedule of element values for the filter is shown below. The first-order section is realised with a simple L section consisting of a series resistor $R_1$ and shunt capacitor $C_1$ buffered from the two second-order sections, which are realised using the circuit of FIG. 1.

| | | |
|---|---|---|
| $C_1$ = 1 nf | $R_1$ = 59.29 k$\Omega$ | First order section |
| $C_{D1}$ = 0.47 nf | $R_{a1}$ = 102.6 k$\Omega$ | |
| $C_{E1}$ = 1 nf | $R_{b1}$ = 46.66 k$\Omega$ | High-Q second-order section |
| $C_{F1}$ = 2.2 nf | $R_{c1}$ = 155.1 k$\Omega$ | |
| $C_{G1}$ = 1 nf | $R_{g1}$ = 250.9 k$\Omega$ | |
| | $R_{h1}$ = 3.010 k$\Omega$ | |
| $C_{D2}$ = 0.47 nf | $R_{a2}$ = 71.73 k$\Omega$ | |
| $C_{E1}$ = 1 nf | $R_{b2}$ = 32.61 k$\Omega$ | Low-Q second-order section |
| $C_{F2}$ = 2.2 nf | $R_{c2}$ = 283.4 k$\Omega$ | |
| $C_{G2}$ = 1 nf | $R_{g2}$ = 55.48 k$\Omega$ | |
| | $R_{h2}$ = 2.426 k$\Omega$ | |

Referring now to FIG. 4, a third order lowpass filter section according to the invention includes in addition to the components of the second-order circuit of FIG. 1 a further junction point $\delta$ at the junction between resistor $R_a$ and capacitor $C_E$. The input terminal 2 is connected to junction point $\delta$ by a resistance $R_p$ and the junction point $\delta$ is connected to circuit ground via a capacitance $C_Q$.

The negative of the transfer function T=Num/Den is given by:

$$\text{Num} = p(F \cdot E \cdot abcD + b \cdot a \cdot EFGgh) \tag{29}$$

$$\begin{aligned}\text{Den} = {} & pQ(F \cdot Gg \cdot abcD + b \cdot c \cdot EFGgh) + \\ & b \cdot c \cdot (a \cdot EFGgh) + (E \cdot FGgh) + \\ & F \cdot Gg(E \cdot abcD + a \cdot bcD) + \\ & a \cdot E(c \cdot F + b \cdot Gg) + \Phi(f_T)\end{aligned} \tag{30}$$

The expression for the denominator is very complicated. However, if the following very important condition is satisfied:

$$b \cdot E = a \cdot F \tag{31}$$

and $\Phi(f_T)$ is neglected as before then the transfer function is:

$$T = \frac{p(F \cdot E \cdot abcD + b \cdot a \cdot EFGgh)}{pQaE(F \cdot Gg \cdot abcD + b \cdot c \cdot EFGgh)} \tag{32}$$

If now the tees are balanced by choosing the component values so that the admittance sums have the same phase angle, then one admittance sum is equal to a scalar (say $\mu$) multiplified by the other, and therefore $$abcD = \mu \cdot EFGgh \tag{33}$$

The transfer function now is:

$$T = \frac{p(\mu \cdot F \cdot E + b \cdot a)}{pQaE(\mu \cdot F \cdot Gg + b \cdot c)} \tag{34}$$

Introducing the complex variable s and re-writing this expression using conventional notation, denoting conductances by G and capacitances by C, $$T = \frac{G_p(\mu C_F C_E s^2 + G_b G_a)}{((C_Q + C_E)s + G_p + G_a)(\mu C_F C_G s^2 + \mu C_F C_g s + G_b G_c)} \tag{35}$$

The expression for the transfer function (in whichever notation) is very simple, and allows the element values to be chosen almost by inspection. If the required transfer function has the form $$T = \text{const.} \times \frac{(s^2 + s_o^2)}{(s + s_1)(s^2 + (s_2/q_2)s + s_2^2)} \tag{36}$$

then we obtain the following relationships by equating terms.

$$s_o^2 = b \cdot a / (\mu F \cdot E) \tag{37}$$

$$s_2^2 = b \cdot c / (\mu F \cdot G) \tag{38}$$

$$q_s = G(s_2/g) \tag{39}$$

$$s_1 = pa/QE \tag{40}$$

provides the two earlier conditions hold, i.e.

$$b \cdot E = a \cdot F \tag{41}$$

$$\mu = abc/gh = D/EFG \tag{42}$$

These six equations are easily solved to yield simple explicit expressions for the conductances in terms of the capacitances and the coefficients of the required transfer function. Thus after suitable values have been chosen for the capacitances (normally preferred values), the conductance values can be found from the following expressions.

$$\mu = D/EFG \tag{43}$$

$$a = E \cdot s_o \sqrt{\mu} \tag{44}$$

-continued $$b = F \cdot s_0 \sqrt{\mu} \tag{45}$$

$$c = G \cdot \sqrt{\mu} \cdot (s_2^2/s_0) \tag{46}$$

$$g = G \cdot (s_2/q_2) \tag{47}$$

$$h = (abc/\mu) - g \tag{48}$$

$$p = QE \cdot s_1 - a \tag{49}$$

If the capacitance values have not been chosen aptly, then one or other of the last two expressions may be negative; in this case a fresh choice of capacitances should be made.

If the capacitance values are known precisely, then the conductances can be easily determined and the network constructed to yield the required response. More usually, the capacitance values have a tolerance of for example ±2% or ±5%. It is then important to be able to achieve the required response by functional trimming of the conductances. A particular advantage of the circuit is that it is easy to develop simple functional trimming routines, because of the simple form of the equations for the conductances given above. One possible routine will now be described.

It is evident by inspection of equations (37) to (40) that conductance a can be used to vary the value of $s_0$, c the value of $s_2$, g the value of $q_2$, and p the value of $s_1$. It is also necessary to satisfy conditions (41) and (42), at least in principle. Condition (42) can be satisfied by adjusting conductance h, to achieve balance of the twin-tee network. Condition (41) cannot be satisfied simultaneously with equation (37), unless the true values of E and F are known. However, it is possible to show that the effect is a small discrepancy in this condition is very slight; it is sufficient for it to hodl approximately, as can be seen if the full expression for the quadratic factor in the denominator of equ. (7) is examined. If b.E./a.F this factor is:

$$\mu \cdot F \cdot Gg + b \cdot c + (b \cdot E - a \cdot F)(a \cdot Gg - c \cdot E)/(abcD \cdot EFGgh) \tag{50}$$

The additional term is small even when (b·E−a·F) is as large as 15% of either b·E or a·F.

Figure 5:
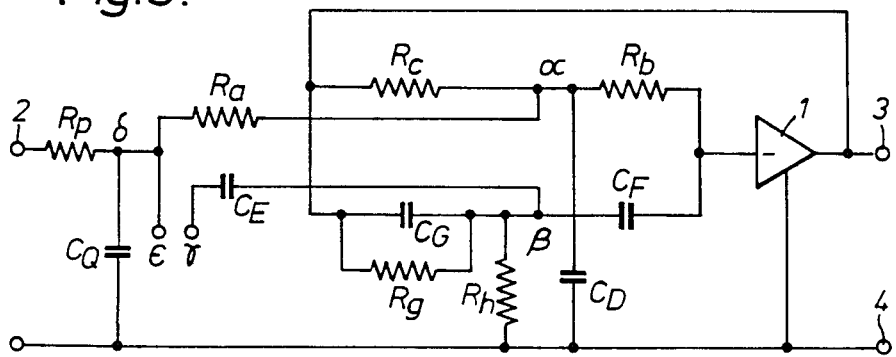
FIG. 5 is a circuit diagram of the filter section of FIG. 4 modified for a trimming procedure.

The trimming routine to be described requires one internal lead of the circuit to be broken and the additional two nodes so created to be made accessible; these nodes are labelled δ and γ in FIG. 5. The steps are as follows (denoting conductances by G with appropriate suffices)

(i) Set $G_b$ to its nominal value.
(ii) Apply a signal of frequency corresponding to $s_0$ to input terminal 2 (with nodes δ and γ joined) and trim $G_a$ for minimum signal at the output terminal 3; this sets the zero frequency.
(iii) Apply a signal of frequency corresponding to $s_2$ to node δ (with node γ grounded), and trim $G_c$ until the phase difference between input signal and output signal is 90° (or somewhat less, e.g. 85°, after allowing for the phase shift through the amplifier, as those skilled in the art will appreciate); this sets the pole frequency of the quadratic factor.
(iv) Apply a signal of frequency corresponding to $s_1$ to input terminal 2 (with nodes δ and γ joined, and nodes α and β both grounded), and trim $G_p$ until the phase difference between the signals at the input terminal 2 and terminal δ is 45°; this sets the first-order pole frequency.
(v) Apply a signal of frequency corresponding to $s_2$ to the input terminal 2 (with nodes δ and γ joined) and adjust $G_g$ until the gain of the section at this frequency is correct; this sets the Q for the quadratic factor.
(vi) Apply a signal of frequency corresponding to $s_0$ to the input terminal 2 (with nodes δ and γ joined) and adjust $G_h$ for maximum attenuation; this balances the twin-tee.

In the foregoing it has been assumed that the function $\Phi(f_T)$ appearing in equ. (2) is negligible. It can be shown that the first-order effects of the finite gainbandwidth product $f_T$ of the amplifier can be offset by small adjustments to the values of $G_c$ and $G_g$, if all the values are determined by calculation. However, if the conductances are trimmed using a routine such as the one given above, the effects of the amplifier $f_T$ (and its other non-ideal properties) are automatically taken into account, to a first-order approximation.

An important property of the circuit is that it is possible to omit capacitor $C_Q$, thereby saving one component and reducing the cost of the section. Equs. (40) and (49) then become:

$$p = E \cdot s_1 - a \tag{51}$$

$$s_1 = pa/E \tag{52}$$

The only significant consequence of omitting capacitor $C_Q$ is that the gain of the section at dc is reduced, which may be undesirable in some applications. Thus the value of the gain at dc is given by $T_o$, where $$T_o = G_a G_p / G_c (G_p + G_a)$$

Where $C_Q$ is omitted, $G_p$ is reduced, as can be seen by comparing equ. (52) with equ. (49), and the value of $T_o$ is reduced.

If both $G_p$ and $C_Q$ are omitted, the section becomes the second-order bi-quadratic section described above. It is interesting to observe therefore that all that is required to turn this second-order section into a third-order section is the single conductance $G_p$. Thus a cascade of m second-order sections of this type realising a transfer function of order 2m can be turned into a cascade of third-order sections by adding m conductances, realising a transfer function of order 3m. The transfer function would be non-standard, however, as it would have m real poles, whereas standard transfer functions have at most one real pole. The extra poles do nevertheless increase the steepness of the transition region substantially by up to 6m db per octave.

It is an additional advantage of the third-order section of FIG. 4 that the sensitivity of the transfer function to small changes in the amplifier $f_T$ is very similar to that of second-order section (obtained by omitting $G_p$ and $C_Q$). This is a surprising feature, since, in general, sensitivity to $f_T$ of single-amplifier sections increases rapidly as the order of the section increases.

A particular advantage of the third order section described is that the values of all the capacitors can be chosen freely so that standard preferred values can be used. The circuit is simple to adjust, allowing capacitors having wide tolerances (e.g. ±2% or ±5% or even ±10%) to be used. This filter section is particularly suited for realisation using thick film hybrid construction, where resistors, capacitors and operational amplifiers are deposited or attached to a substrate and where the resistor values are trimmed using air-abrasive or laser techniques. The condition b·E=a·F expressed as equation (31) has been found to be important to achieve a practically useful third-order section. It has been found that the condition need only hold approximately, i.e. up to 15% of either term, and deviation of 20% may in some circumstances be tolerated. However further deviation from equality is likely to result in unsatisfactory or inoperative networks.

A highpass version of the third-order section according to the invention will now be described with reference to FIG. 6. The circuit has similar advantages to the low pass version. The circuit is the same as the low pass circuit shown in FIG. 4 except that (using the terminology of FIG. 5) resistance $R_p$ and capacitance $C_Q$ are replaced by a capacitance $C'_p$ and a resistance $R'_q$ respectively. The circuit components $R'_a$, $C'_E$ etc. are designated by a single prime to distinguish from the corresponding lowpass components.

The negative of the transfer function of this section is:

$$T = \frac{Ps(\mu F \cdot Es^2 + b \cdot a)}{(PEs + qa)(\mu F \cdot Gs^2 + \mu F \cdot gs + b \cdot c)} \quad (53)$$

which may be compared with equ. (34). Analogous equations to equations (40) and (49) are:

$$s_1 = qa/PE \quad (54)$$

$$q = PE \cdot s_1 - a \quad (55)$$

The other equations i.e. equations (37) to (39), and equations (41) to (48) remain unchanged.

A trimming routine similar to the one described above for the lowpass version can be used for the highpass version, with only step (iv) needing modification, in a way which is evident from equation (55) i.e. it is $G_q$ which requires to be trimmed. Alternatively, it is possible to omit $G_q$ altogether (just as $C_Q$ can be omitted from the lowpass version). The section can then be trimmed by using $G_a$ to set $s_1$, $G_b$ to set $s_0$, and $G_c$ to set $s_1$, and so on in a similar manner to the routine described above.

A third-order all pass network can be realised by connecting the lowpass section of FIG. 4 with a second operational amplifier 6 arranged as a summing amplifier, as shown in FIG. 7. The lowpass section is shown at 5 in the figure. The output terminal of the amplifier 1 is connected via a resistance $R_y$ to the inverting input terminal of the amplifier 6.

The input terminal of the lowpass section is connected to the inverting input of the amplifier 6 via a resistance $R_w$ which in turn is connected to the output terminal of the amplifier 6 via a resistance $R_x$.

The general expression for the transfer function of a third-order allpass network is:

$$\frac{s^3 - as^2 + bs - c}{s^3 + as^2 + bs + c} \quad (56)$$

This expression can be rewritten as:

$$-\frac{2as^2 + 2c}{s^3 + as^2 + bs + c} + 1 \quad (57)$$

The first term in this expression can be realised, to within a multiplying factor, by the third-order lowpass section 5, and the addition of unity can be effected by the summing amplifier 6. If the transfer function of the third-order lowpass section is denoted by $T_{lp}$, we can write the transfer function of the circuit of FIG. 7 as $T_{ap}$ where:

$$T_{ap} = \left(\frac{Rx}{Rw}\right)\left[\left(\frac{Rw}{Ry}\right) \cdot T_{lp} + 1\right] \quad (58)$$

The constant multiplying $T_{lp}$ is a function of the two resistances, $R_x$, $R_y$ and can easily be adjusted to obtain the desired allpass transfer function $T_{ap}$ from the lowpass function $T_{lp}$. A particular advantage of this network is that the lowpass section can easily be trimmed using the routine given above so that the allpass network of FIG. 4 is easy to tune (unlike many realisation of allpass functions).

As examples of the lowpass and highpass third-order sections, the design of a 9th-order bandpass filter will now be described which is suitable for band-limiting an audio telephone channel between 300 Hz and 3.4 kHz. Such a filter could be used as a p.c.m. anti-alias filter. The filter consists of a third-order highpass section with a passband ripple of 0.05 dB, cut-off frequency of 220 Hz and 38 dB stopband rejection, cascaded with a 6th order lowpass filter having a non-standard transfer function, composed of two of the third-order lowpass sections, with a passband ripple of 0.2 dB, cut-off frequency of 3.54 kHz and a stopband rejection of 32 dB.

The transfer function of the highpass section is given by:

$$T_1 = \frac{(s^2 + 0.0002414)}{(s + 0.05651)(s^2 + 0.03606 + 0.002279)} \quad (59)$$

The transfer function of the high Q lowpass section is given by:

$$T_2 = \frac{(s^2 + 1.41269)}{(s + 0.9966)(s^2 + 0.11255s + 0.05997)} \quad (60)$$

The transfer function of the low Q lowpass section is given by:

$$T_3 = \frac{(s^2 + 2.33742)}{(s + 0.9966)(s^2 + 0.57957s + 0.84616)} \quad (61)$$

It should be noted that the real poles of the two lowpass sections are coincident. The functions are all normalised to the same frequency, and are denormalised to 3.54 kHz to yield the required audio bandpass range.

The schedule of element values for the three sections is as follows:

| | | |
|---|---|---|
| $C_{1D}$ = 15 nF | $R_{1a}$ = 302.2 kΩ | |
| $C_{1E}$ = 15 nF | $R_{1b}$ = 302.2 kΩ | |
| $C_{1F}$ = 15 nF | $R_{1c}$ = 70.59 kΩ | Highpass Section |
| $C_{1G}$ = 6.8 nF | $R_{1g}$ = 183.4 kΩ | |
| $C_{1Q}$ = 15 nF | $R_{1h}$ = 21.96 kΩ | |
| | $R_{1p}$ = 29.07 kΩ | |
| $C_{2D}$ = 0.47 nF | $R_{2a}$ = 68.52 kΩ | |
| $C_{2E}$ = 1.5 nF | $R_{2b}$ = 218.7 kΩ | |
| $C_{2F}$ = 0.47 nF | $R_{2c}$ = 91.32 kΩ | Lowpass High-Q Section |
| $C_{2G}$ = 1.5 nf | $R_{2g}$ = 266.3 kΩ | |
| $C_{2Q}$ = 1.5 nf | $R_{2h}$ = 4.575 kΩ | |
| | $R_{2p}$ = 19.27 kΩ | |
| (Alternatively $C_{2Q}$ = 0 and $R_{2p}$ = 53.60 kΩ) | | |
| $C_{3D}$ = 0.47 nF | $R_{3a}$ = 53.27 kΩ | |
| $C_{3E}$ = 1.5 nF | $R_{3b}$ = 170.0 kΩ | |
| $C_{3F}$ = 0.47 nF | $R_{3c}$ = 147.1 kΩ | Lowpass Low-Q Section |
| $C_{3G}$ = 1.5 nF | $R_{3g}$ = 51.72 kΩ | |
| $C_{3Q}$ = 1.5 nF | $R_{3h}$ = 4.700 kΩ | |
| | $R_{3p}$ = 20.95 kΩ | |
| (Alternatively $C_{3Q}$ = 0 and $R_{3p}$ = 69.07 kΩ) | | |

If the capacitances have a tolerance of ±2%, then the resistances should initially be set to a value 10% below the nominal values given above (20% below for $R_g$), and trimmed according to the routine given (or some other preferred routine), with the exception of the resistances $R_{1b}$, $R_{2b}$, $R_{3b}$, which should be given their nominal values.

A shorter trimming routine which has been found successful in practice is as follows:

(a) Set $G_a$ to its nominal value.

(b) Apply a signal of frequency $s_o$ to input terminal 2, and trim $G_b$ for minimum signal at the output terminal 3; this sets the zero frequency.

(c) Apply a signal of frequency $s_2$ to input terminal 2, and trim $G_c$ until the phase difference between the input signal and the output signal is equal to the value calculated from the third-order transfer function (after allowing for the phase shift through the amplifier, as those skilled in the art will appreciate); this sets the pole frequency of the quadratic factor sufficiently close to the required value.

(d) Apply a signal of frequency $s_2$ to input terminal 2, and trim $G_g$ until the gain of the section at this frequency is correct; this sets the Q of the quadratic factor. In th case of the section of highest Q in a filter, the signal should be applied to the input of the complete filter, and the component $G_g$ adjusted until the passband of the whole filter is as flat as possible (or has the desired response if not flat).

With this shorter routine, no internal connections need to be made to the section, nor any internal connections broken; all connectors are made to terminals 2 and 3. Using the shorter routine, 6th-order lowpass filters have been successfully adjusted to specification using capacitors of ±2% or ±5% tolerance, and a high yield (greater than 95%) achieved using capacitors of ±10% tolerance. The resistances need to be set at correspondingly greater percentages below the nominal values before trimming is started. Thus for ±2% capacitances, $R_b$, $R_c$, and $R_g$ need to be set 10%, 10% and 20% low, and for ±5% capacitances 20%, 20% and 35% low; using ±10% capacitances 30%, 30% and 60% was successful in achieving a high yield.

As should now be apparent, one may realize an RC active filter of odd order 2m+3 using m second order sections (e.g. as shown in FIG. 1, 2 or 3) and one third order section (e.g. as shown in FIG. 4 or 6) as schematically depicted in FIG. 8. Further, one may realize an RC active filter of order 3m using m third order sections (e.g. as shown in FIG. 4 or 6) as schematically depicted in FIG. 9.

I claim:

1. A second-order filter section comprising:
a single high-gain, high input impedance, inverting amplifier with low output impedance whose output terminal provides the output terminal of the section,
an input terminal, and
a twin-tee network, comprising resistance and capacitance elements and having:
a first resistance element ($R_a$),
a first capacitance element ($C_E$),
a first node (α) connected to the inverting input of the amplifier via a second resistance element ($R_b$), to the output terminal of the amplifier via a third resistance element ($R_c$), and to circuit ground via a second capacitance element ($C_D$); and
a second node (β) connected to the inverting input of the amplifier via a third capacitance element ($C_F$), to the output terminal of the amplifier via the parallel combination of a fourth capacitance element ($C_G$) and a fourth resistance element ($R_g$), and to circuit ground via a fifth resistance element ($R_h$),
the input terminal being connected to the first node (α) via the first resistance element ($R_a$) and to the second node (β) via the first capacitance ($C_E$).

2. A second-order bandpass filter section comprising:
a single high-gain, high input impedance, inverting amplifier with low output impedance whose output terminal provides the output terminal of the section,
an input terminal, and
a twin-tee network, comprising resistance and capacitance elements and having:
a first node (α) connected to the inverting input of the amplifier via a first resistance element ($R_b$), to the output terminal of the amplifier via a second resistance element ($R_c$), and
a second node (β) connected to the inverting input of the amplifier via a first capacitance element ($C_F$), to the output terminal of the amplifier via the parallel combination of a second capacitance element ($C_G$) and a third resistance element ($R_g$), and further comprising:
a connection between the input terminal and the first junction point via a third capacitance element ($C_A$), and a connection between the second junction point and circuit ground via a fourth resistance element ($R_h$).

3. A second-order filter section comprising:
a single high-gain, high input impedance, inverting amplifier with low output impedance whose output terminal provides the output terminal of the section,
an input terminal, and
a twin-tee network, comprising resistance and capacitance elements and having:
a first node (α) connected to the inverting input of the amplifier via a first resistance element ($R_b$), to the output terminal of the amplifier via a second resistance element ($R_c$),
a second node (β) connected to the inverting input of the amplifier via a first capacitance element ($C_F$), to the output terminal of the amplifier via the parallel combination of a second capacitance element ($C_G$) and a third resistance element (Rg), and series resistance elements ($R_x$) and ($R_y$) connected between the input terminal and circuit ground, the junction between these series resistance elements being connected to the non-inverting input terminal of the amplifier, and further comprising a connection between the input terminal and the first junction point via a third capacitance element ($C_A$), and a connection between the second junction point and circuit ground via a fourth resistance element ($R_h$).

4. A third-order lowpass filter section comprising a single high-gain, high input impedance, inverting amplifier with low output impedance whose output terminal provides the output terminal of the section, a twin-tee network, comprising resistance and capacitance elements and an input network, comprising an input terminal connected to an input resistance element ($R_p$); the twin-tee network having a first node ($\alpha$) connected to that terminal of the input resistance element remote from the input terminal via a first resistance element ($R_a$), to the inverting input of the amplifier via a second resistance element ($R_b$), to the output terminal of the amplifier via a third resistance element ($R_c$), and to circuit ground via a first capacitance element ($C_D$); and a second node ($\beta$) connected to that terminal of the input resistance element remote from the input terminal via a second capacitance element ($C_E$), to the inverting input of the amplifier via a third capacitance element ($C_F$), to the output terminal of the amplifier via the parallel combination of a fourth capacitance element ($C_G$) and a fourth resistance element ($R_g$), and to circuit ground via a fifth resistance element ($R_h$).

5. A third-order lowpass filter section as claimed in claim 4 wherein the input network includes an input capacitance element ($C_Q$) connected between circuit ground and the junction of the input resistance element with the first resistance ($R_a$) and second capacitance ($C_E$) elements.

6. A third-order lowpass filter section as claimed in claim 4 wherein the product of the values of the admittance of the first resistance element ($R_a$) and the third capacitance element ($C_F$) is substantially equal to the product of the values of the admittance of the second resistance element ($R_b$) and the second capacitance element ($C_E$).

7. A third order filter section as in claim 4 in further combination with m second-order sections, m being an integer.

8. A plurality m of third order filter sections as in claim 4 inter-connected to provide an RC-active filter of order 3m, m being an integer.

9. A third order lowpass filter section as claimed in claim 4 in further combination with a summing amplifier whose output terminal provides the network output, the inverting input terminal of the summing amplifier being connected to the output terminal of said amplifier of the lowpass filter section by a first additional resistance element ($R_y$), and to the input terminal of said lowpass filter section via a second additional resistance element ($R_w$) and to the output terminal of the summing amplifier via a third additional resistance element ($R_x$).

10. A third-over highpass filter section comprising a single high gain, high input impedance, inverting amplifier with low output impedance whose output terminal provides the output terminal of the section, a twin-tee network comprising resistance and capacitance elements, and an input network comprising an input junction point connected to the input terminal of the section via a capacitance element ($C_p'$), the twin-tee network having a first node connected to the input junction point via a first resistance element ($R_a'$) to the inverting input of the amplifier via a second resistance element ($R_b'$), to the output terminal of the amplifier via a third resistance element ($R_c'$) and to circuit ground via a first capacitance element ($C_D'$);

and a second node connected to the input junction point via a second capacitance element ($C_E'$), to the inverting input of the amplifier by a third capacitance element ($C_F'$), to the output terminal of the amplifier via the parallel combination of a fourth capacitance element ($C_G'$) and a fourth resistance element ($R_g'$), and to circuit ground via a fifth resistance element ($R_h'$).

11. A third-order highpass filter section as claimed in claim 10 wherein the input network includes an input resistance element ($R_g'$) connected between circuit ground and the input junction point.

12. A third-order highpass filter section as claimed in claim 10 wherein the product of the values of the admittance of the first resistance element ($R_a'$) and the third capacitance element ($C_F'$) is substantially equal to the product of the values of the admittance of the second resistance element ($R_b'$) and the second capacitance element ($C_E'$).

13. A second order filter section comprising:
a single high-gain, high input impedance, inverting amplifier with low output impedance, inverting amplifier with low output impedance whose output terminal provides the output terminal of the section,
an input terminal, and
a twin-tee network, comprising resistance and capacitance elements having:
a first resistance element ($R_a$),
a first node ($\alpha$) connected to the inverting input of the amplifier via a second resistance element ($R_b$), to the output terminal of the amplifier via a third resistance element ($R_c$), and to circuit ground via a first capacitance element ($C_D$); and
a second node ($\beta$) connected to the inverting input of the amplifier via a second capacitance element ($C_F$), to the output terminal of the amplifier via the parallel combination of a third capacitance element ($C_G$) and a fourth resistance element (Rg), and to circuit ground via a fifth resistance element ($R_h$),
the input terminal being connected to the first node ($\alpha$) via the first resistance element ($R_a$).

14. A second-order filter section comprising:
a single high-gain, high input impedance, inverting amplifier with low output impedance, inverting amplifier with low output impedance whose output terminal provides the output terminal of the section,
an input terminal, and
a twin-tee network, comprising resistance and capacitance elements having:
a first capacitance element ($C_E$), a first node (α) connected to the inverting input of the amplifier via a first resistance element ($R_b$), to the output terminal of the amplifier via a second resistance element ($R_c$), and to circuit ground via a second capacitance element ($C_D$), and a second node (β) connected to the inverting input of the amplifier via a third capacitance element ($C_F$), to the output terminal of the amplifier via the parallel combination of a fourth capacitance element ($C_G$) and a third resistance element ($R_g$), and to circuit ground via a fourth resistance element ($R_h$), the input terminal being connected to the second node (β) via the first capacitance ($C_E$).

15. A second-order bandpass filter section comprising:

a single high-gain, high input impedance, inverting amplifier with low output impedance whose output terminal provides the output terminal of the section, an input terminal, and a twin-tee network, comprising resistance and capacitance elements and having:

a first node (α) connected to the inverting input of the amplifier via a first resistance element ($R_b$), to the output terminal of the amplifier via a second resistance element ($R_c$), and a second node (β) connected to the inverting input of the amplifier via a first capacitance element ($C_F$), to the output terminal of the amplifier via the parallel combination of a second capacitance element ($C_G$) and a third resistance element ($R_g$), and further comprising: a connection between the input terminal and the second junction point via a fourth resistance element ($R_e$) and a connection between the first junction point and circuit ground via a third capacitance element ($C_D$).

16. A second-order bandpass filter section comprising:

a single high-gain, high input impedance, inverting amplifier with low output impedance whose output terminal provides the output terminal of the section, an input terminal, and a twin-tee network, comprising resistance and capacitance elements and having:

a first node (α) connected to the inverting input of the amplifier via a first resistance element ($R_b$), to the output terminal of the amplifier via a second resistance element ($R_c$), and a second node (β) connected to the inverting input of the amplifier via a first capacitance element ($C_F$), to the output terminal of the amplifier via the parallel combination of a second capacitance element ($C_G$) and a third resistance element ($R_g$), and further comprising: a connection between the input terminal and the second junction point via a fourth resistance element ($R_e$) and a connection between the input terminal and the first junction point via a third capacitance element ($C_A$).

17. A second-order filter section comprising:

a single high-gain, high input impedance, inverting amplifier with low output impedance whose output terminal provides the output terminal of the section, an input terminal, and a twin-tee network, comprising resistance and capacitance elements and having:

a first node (α) connected to the inverting input of the amplifier via a first resistance element ($R_b$), to the output terminal of the amplifier via a second resistance element ($R_c$), a second node (β) connected to the inverting input of the amplifier via a first capacitance element ($C_F$), to the output terminal of the amplifier via the parallel combination of a second capacitance element ($C_G$) and a third resistance element (Rg), and series resistance elements ($R_x$) and ($R_y$) connected between the input terminal and circuit ground, the junction between these series resistance elements being connected to the non-inverting input terminal of the amplifier, and further comprising a connection between the input terminal and the second junction point via a fourth resistance element ($R_e$) and a connection between the first junction point and circuit ground via a third capacitance element ($C_D$).

18. A second-order filter section comprising:

a single high-gain, high input impedance, inverting amplifier with low output impedance whose output terminal provides the output terminal of the section, an input terminal, and a twin-tee network, comprising resistance and capacitance elements and having:

a first node (α) connected to the inverting input of the amplifier via a first resistance element ($R_b$), to the output terminal of the amplifier via a second resistance element ($R_c$), a second node (β) connected to the inverting input of the amplifier via a first capacitance element ($C_F$), to the output terminal of the amplifier via the parallel combination of a second capacitance element ($C_G$) and a third resistance element (Rg), and series resistance elements ($R_x$) and ($R_y$) connected between the input terminal and circuit ground, the junction between these series resistance elements being connected to the non-inverting input terminal of the amplifier, and further comprising a connection between the input terminal and the second junction point via a fourth resistance element ($R_e$) and a connection between the input terminal and the first junction point via a third capacitance element ($C_A$).

* * * * *